United States Patent [19]

Ichimura et al.

[11] 4,339,524
[45] Jul. 13, 1982

[54] PHOTOSENSITIVE RESINOUS MATERIALS CONTAINING STILBAZOLIUM GROUPS

[75] Inventors: Kunihiro Ichimura, Yatabe; Osamu Takeuchi, Hino; Hideo Kusama, Yokohama; Kazuo Yamazaki, Kashiwa; Akira Saka, Ichinomiya; Hiroshi Ito, Ohmorinishi; Kunitaka Toyofuku, Tokyo, all of Japan

[73] Assignees: Agency of Industrial Science & Technology Ministry of International Trade and Industry; Sony Corporation; Oji Paper Co., Ltd., all of Japan

[21] Appl. No.: 254,062

[22] Filed: Apr. 14, 1981

[30] Foreign Application Priority Data

Apr. 17, 1980 [JP] Japan .................... 55-51056

[51] Int. Cl.$^3$ .............................. G03C 1/68
[52] U.S. Cl. ........................ 430/270; 430/28; 525/61; 525/375
[58] Field of Search ............ 430/270, 28; 525/61, 525/375

[56] References Cited

U.S. PATENT DOCUMENTS 3,514,421  5/1970  Kershaw et al. ............... 525/61
3,649,269  3/1972  Kubota ........................ 430/28
4,131,465  12/1975 Petropoulos ................... 430/270

Primary Examiner—Jack P. Brammer
Attorney, Agent, or Firm—Hill, Van Santen, Steadman, Chiara & Simpson

[57] ABSTRACT

A partially saponified polyvinyl acetate having at least one stilbazolium group-containing photosensitive unit represented by the following general formula:

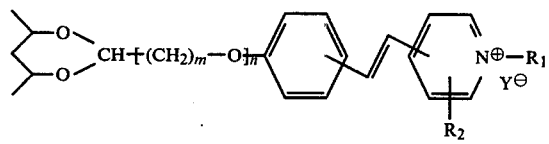

(wherein $R_1$ is hydrogen atom, an unsubstituted or substituted alkyl group, an alkenyl group or an aralkyl group, $R_2$ is hydrogen atom or an unsubstituted or substituted alkyl group, Y is a conjugated base of an inorganic or organic acid, m is an integer of 1 to 6, and n is 0 or 1) and an acetal unit represented by the following general formula:

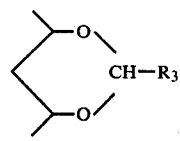

(wherein $R_3$ is hydrogen atom or an alkyl group); the acetal units being contained therein in an amount of approximately 0.5 to 10.0 mol % with respect to mole of the polyvinylalcohol units thereof; the stilbazolium group-containing units being contained therein in an amount of approximately 0.5 to 5.0 mol % with respect to mole of the polyvinylalcohol units thereof; and having a degree of polymerization of approximately 500 to 3,000 and a degree of saponification of approximately 60% or higher. This polyvinyl acetate can be used as photosensitive resinous materials or compositions suitable for the fluorescent screen of a cathode ray tube.

21 Claims, 3 Drawing Figures

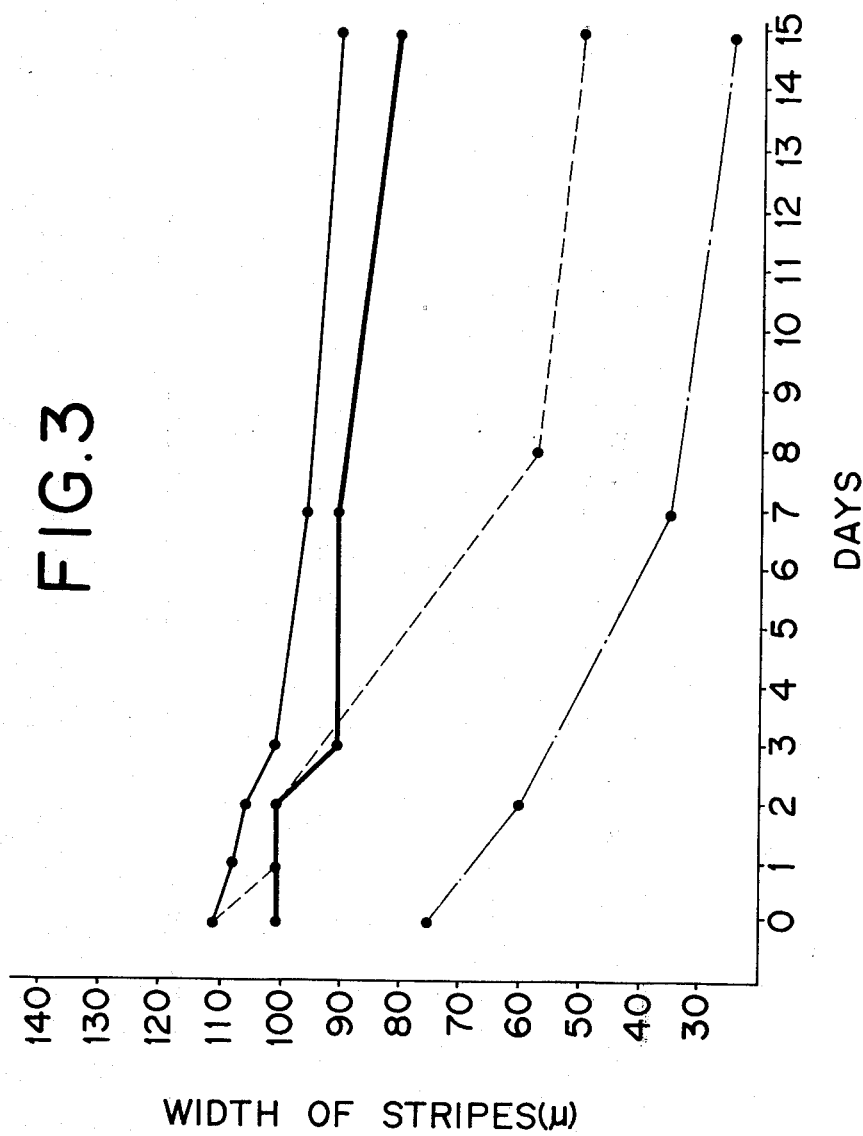

PHOTOSENSITIVE RESINOUS MATERIALS CONTAINING STILBAZOLIUM GROUPS

BACKGROUND OF THE INVENTION

1. Field of the Invention

The present invention relates to a photosensitive resinous material suitable particularly for fluorescent screens of cathode ray tubes such as color or black-and-white television picture tubes.

2. Brief Description of the Prior Art

Fluorescent screens of color television picture tubes are usually coated with a light-absorbing material such as carbon between their fluorescent layers to ensure a favorable contrast of color pattern by preventing the light from scattering or reflecting. To form a pattern of light-absorbing material, conventional technique involves coating a polyvinylalcohol containing a dichromate on the inner surface of the face plate of a cathode ray tube, converting portions of the polyvinylalcohol layer into the water-insoluble material by means of selective exposure to light, removing the unexposed portions by washing them with water, coating the light-absorbing material containing graphite and then removing both the polyvinylalcohol layers and the light-absorbing layers superposed thereon by the aid of a $H_2O_2$ aqueous solution followed by the washing with water. This technique can allow the light-absorbing material layers to be left coated directly on the portions of the face plate corresponding to the unexposed or uncured portions which were previously removed. The portions of the inner face plate surface between the light-absorbing layers are then coated in turn with fluorescent slurries comprising polyvinylalcohol, a photosensitive resin containing a dichromate, and an illuminating fluorescent substance in red, green or blue color, respectively. The coating is then exposed to light, developed and subsequently baked to form a desired fluorescent pattern in the given color. This technique is repeated to form a fluorescent screen having fluorescent red, green and blue colors.

In conventional technique of forming patterns of a light-absorbing and/or fluorescent material, a dichromate has been employed as a photosensitive agent so that a velocity of curing by exposure to light is not sufficiently fast and accordingly a longer period of light exposure or an amount of light and/or a source of light having a stronger energy is required. These are practically inadvantageous economically or in productivity. The use of the dichromate also presents drawbacks that it rather adversely interferes with an illumination efficiency of fluorescent materials to be employed and that it may cause a pollution resulting from chromium. There is also a room for improvement in an adherence strength of the polyvinylalcohol layer to the face plate of a cathode ray tube.

SUMMARY OF THE INVENTION

The present invention has an object to provide a photosensitive resinous material having improved characteristics particularly for forming the fluorescent screen of a cathode ray tube.

Another object of the present invention is to provide a photosensitive resinous material which can be cured or hardened in a reasonably short period of exposure to light.

A further object of the present invention is to provide a photosensitive resinous material which can provide a fluorescent screen with a high illumination efficiency.

A still further object of the present invention is to provide a photosensitive resinous material which is free from a pollution resulting from chromium compounds.

Another further object of the present invention is to provide a photosensitive resinous material which can exhibit an improved strength in adhesion to the face plate of a cathode ray tube and a high sensitivity to light.

BRIEF DESCRIPTION OF THE DRAWINGS

FIG. 3 is a graph illustrating the relationship of width of stripes (in microns) with a period of days at different pH ranges.

DETAILED DESCRIPTION OF THE PREFERRED EMBODIMENTS

Figure 1:
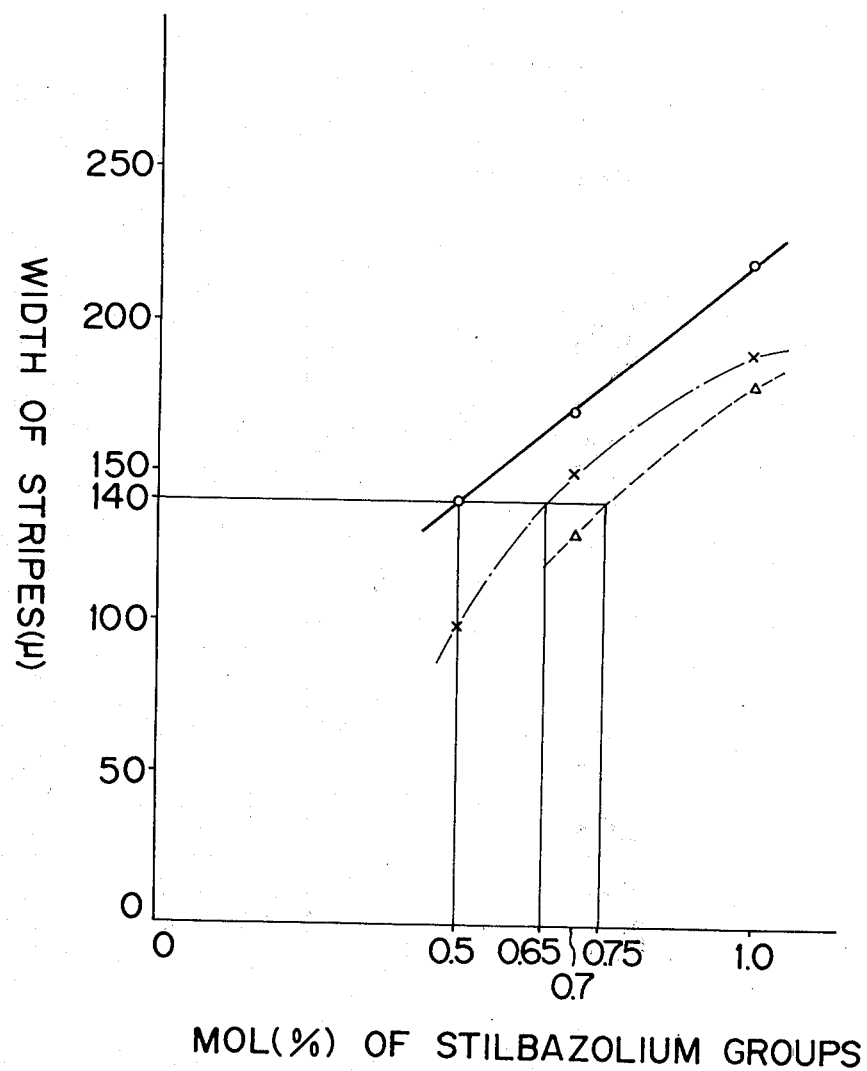
FIG. 1 is a graph illustrating the relationship of width of stripes (in microns) with an amount of stilbazolium groups in the partially saponified polyvinyl acetate in accordance with the present invention.

The partially saponified polyvinyl acetate to be used for the photosensitive resinous material in accordance with the present invention contains at least one stilbazolium group-containing photosensitive unit represented by the following general formula (I):

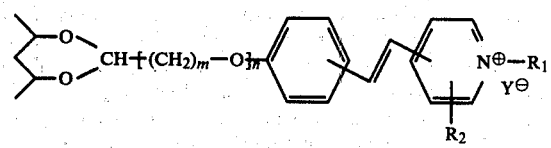

(wherein $R_1$ is hydrogen atom, an unsubstituted or substituted alkyl group, an alkenyl group or an aralkyl group, $R_2$ is hydrogen atom or an unsubstituted or substituted alkyl group, Y is a conjugated base of an inorganic or organic acid, m is an integer of 1 to 6, and n is 0 or 1) and an acetal unit represented by the following general formula (II):

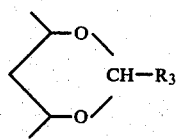

(wherein $R_3$ is hydrogen atom or an alkyl group).

Thus, the partially saponified polyvinyl acetates may be schematically represented by the following general formula (III):

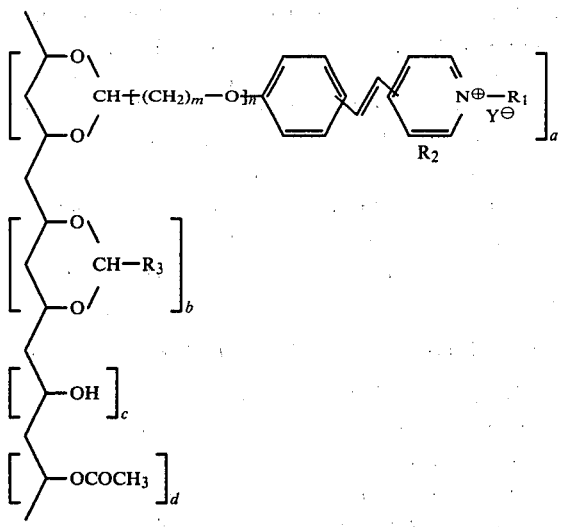

(wherein $R_1$, $R_2$, $R_3$, Y, m and n have the same meanings as hereinabove referred to and a, b, c and d are each mol% with respect to mol of the polyvinyl alcohol units).

In the above formulas, the term "alkyl" referred to as such and as the unsubstituted or substituted alkyl group is intended to mean a monovalent, straight and branched-chain, aliphatic hydrocarbon residue having from 1 to 6 carbon atoms and, preferably 1 to 4 carbon atoms. Illustrative of such alkyl groups may be methyl, ethyl, propyl, isopropyl, butyl, isobutyl, hexyl and the like. The term "substituted alkyl" is intended to mean an alkyl group as defined hereinabove having a substituent such as hydroxyl, carbamoyl or the like. The term "alkenyl" is intended to mean a divalent, straight or branched-chain, aliphatic hydrocarbon residue having from 1 to 6 and, preferably from 1 to 4. The alkenyl group may include, for example, ethenyl, 1-propenyl, allyl and the like. The term "aralkyl" is intended to mean a combination of an aromatic ring with an alkyl group and may include particularly benzyl group.

The partially saponified polyvinyl acetates as represented by the general formula (III) and having the stilbazolium group-containing photosensitive units represented by the general formula (I) wherein n is zero (0) may be prepared, for example, by reacting a stilbazolium aldehyde compound represented by the following general formula (IVa):

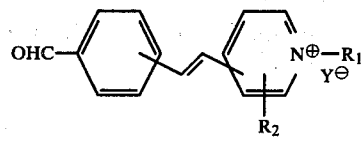

(wherein $R_1$, $R_2$ and Y have the same meanings as hereinabove defined) and a "normal" aldehyde represented by the following general formula (V):

(wherein $R_3$ has the same meaning as hereinabove defined) with the partially saponified vinyl acetate trunk polymer by means of the high-polymer acetalization. This reaction allows the acetal linkages to be formed between the stilbazolium aldehyde compound and a pair of adjacent hydroxyl groups of the trunk polymer and between the normal aldehyde and another pair of adjacent hydroxyl groups thereof.

The partially saponified polyvinyl acetates as represented by the general formula (III) and having the stilbazolium group-containing photosensitive units represented by the general formula (I) wherein n is one (1) may be prepared, for example, by reacting a stilbazolium acetal compound represented by the following general formula (IVb):

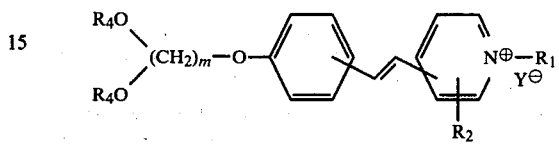

(wherein $R_4$ is a lower alkyl group having 1 to 4 carbon atoms, a phenyl group or, when taken together, an alkylene group having 2 to 4 carbon atoms, and $R_1$, $R_2$ and Y have the same meanings as hereinabove defined) in substantially the same manner as hereinabove set forth by the high-polymer interacetalization.

The acetalization reactions may be carried out in the presence of an acid catalyst such as phosphoric acid, hydrochloric acid or sulfonic acid.

In the partially saponified polyvinyl acetate as represented by the general formula (III), the stilbazolium group containing photosensitive units represented by the general formula (I) may be preferably contained in an amount of approximately 0.5 to 5.0 mol% with respect to mole of the polyvinyl alcohol units thereof and the acetal units represented by the general formula (II) may be preferably contained in an amount of approximately 0.5 to 10.0 mol% with respect thereto. The partially saponified polyvinyl acetate may preferably have a degree of polymerization ranging from approximately 500 to 3,000 and a degree of saponification of approximately 60% or higher and, more preferably, approximately 70% or higher. When an amount of the stilbazolium group-containing photosensitive units represented by the general formula (I) is too small, a degree of cross-linking is rendered so insufficient that a strength of layers is weakened and consequently the layers are likely to come off during treatment. On the other hand, where an amount of the photosensitive units is too much, curing or hardening proceeds too much so that a pattern of cured or hardened portions cannot be remained as desired. Where an amount of the acetal units represented by the general formula (II) is below the lower limit, a strength of adhesion to the face plate of a cathode ray tube cannot be increased to a sufficient degree. Where an amount of the photosensitive units is beyond the upper limit, a layer to be formed on the face plate surface thereof is rendered so opaque that light cannot penetrate the layer to a sufficient extent and consequently a degree of light scattering becomes great, thereby curing or hardening unnecessary portions, too, and deforming the outer or peripheral shape of a desired pattern.

Where the degree of saponification of the partially saponified polyvinyl acetate is below the lower limit, the polyvinylalcohols become so insoluble in water that the development with water is rendered impossible.

The stilbazolium aldehyde compounds of the general formula (IVa) to be employed for the preparation of the partially saponified polyvinyl acetates in accordance with the present invention may include, for example, 1-methyl-2-(p-formylstyryl)pyridinium, 1-methyl-4-(p-formylstyryl)pyridinium, 1-ethyl-2-(p-formylstyryl)pyridinium, 1-ethyl-4-(p-formylstyryl)pyridinium, 1-propyl-4-(p-formylstyryl)pyridinium, 1-isopropyl-4-(p-formylstyryl)pyridinium, 1-butyl-4-(p-formylstyryl)pyridinium, 1-hexyl-4-(p-formylstyryl)pyridinium, 1-methyl-2-(p-formylstyryl)-5-methylpyridinium, 1-methyl-4-(p-formylstyryl)-5-ethylpyridinium, 1-ethyl-3-(p-formylstyryl)-4-methylpyridinium, 1-(2-hydroxyethyl)-2-(p-formylstyryl)pyridinium, 1-(2-hydroxylethyl)-4-(p-formylstyryl)pyridinium, 1-carbamoylmethyl-2-(p-formylstyryl)pyridinium, 1-carbamoylmethyl-4-(p-formylstyryl)pyridinium, 1-allyl-4-(p-formylstyryl)pyridinium, 1-benzyl-2-(p-formylstyryl)pyridinium, 1-benzyl-4-(p-formylstyryl)pyridinium, 1-benzyl-2-(p-formylstyryl)-5-methylpyridinium, 1-benzyl-4-(p-formylstyryl)-5-methylpyridinium and 1-benzyl-3-(p-formylstyryl)-4-ethylpyridinium salts. The stilbazolium acetal compounds of the general formula (IVb) may include, for example, 1-methyl-2-[p-(2,2-dimethoxyethoxy)-styryl]-pyridinium, 1-methyl-2-[o-(2,2-dimethoxyethoxy)-styryl]pyridinium, 1-methyl-2-[m-(2,2-dimethoxyethoxy)-styryl]pyridinium, 1-methyl-2-[p-(2,2-diethoxyethoxy)-styryl]pyridinium, 1-methyl-4-[p-(2,2-dimethoxyethoxy)-styryl]pyridinium, 1-propyl-4-[p-(2,2-dimethoxyethoxy)-styryl]pyridinium, 1-benzyl-4-[p-(2,2,dimethoxyethoxy)-styryl]pyridinium, 1-methyl-4-[p-(3,3-dimethoxypropoxy)-styryl]pyridinium, 1-methyl-4-[p-(4,4-dimethoxybutoxy)-styryl]pyridinium, 1-methyl-4-[p-(2,2-ethylenedioxoethoxy)-styryl]pyridinium and 1-methyl-4-[p-(2,2-dimethoxyethoxy)-styryl]-3-ethyl-pyridinium salts. The salts may include, for example, halides such as chloride, bromide and iodide, sulfate, methosulfate, p-toluenesulfonate, methanesulfonate, perchlorate and the like. The styryl moiety of the stilbazolium groups may be in the position para to the nitrogen atom of the pyridinium nucleus as well as ortho thereto. When the styryl moiety is in the position para to the nitrogen atom of the pyridinium group, a yellow light may be used for irradiation.

It is considered in accordance with the present invention that light energy can rapidly dimerize the stilbazolium groups each other to cross-link one polymer with another polymer and simultaneously cause the cross-linking within the polymer molecule, thereby curing the resinous materials. The cross-linking between the stilbazolium groups is a dimerization or a cyclization-addition reaction between the ethylenically unsaturated double bonds of the stilbazolium groups.

The photosensitive resinous materials in accordance with the present invention comprise the partially saponified polyvinyl acetate having the units as represented by the general formula (III) and a photosensitive resinous composition containing the partially saponified polyvinyl acetate as represented by the general formula (III).

The photosensitive resinous materials may be employed in the form of a solution. A solvent may preferably be water. The hydrogen ion concentration of the solution may exert an influence on a sensitivity of the materials to light. When the solution is in the range of a neutral pH range by the addition of a pH adjusting agent such as base, e.g., ammonia, a variation in sensitivity is rendered small. It is presumed that this will result from the fact that the reaction of forming the acetal linkage for the introduction of the photosensitive groups into the partially saponified vinyl acetate trunk polymer is in equilibrium and consequently no elimination of the quaternary stilbazolium groups from the partially saponified polyvinyl acetate by means of an acid catalyst will occur in the neutral pH range.

The photosensitive resinous materials in accordance with the present invention may further contain a water-soluble lower alcohol such as methanol, ethanol, isopropanol or the like. An amount of the lower alcohol may range from about 25% by weight or lower and, preferably, from about 10 to 25% by weight of a solvent. The addition of the lower alcohol may be preferred for the preparation of a photosensitive resinous composition and/or in exposure to light because it can provide a combination of an increase in solubility of the polymer treated with the aldehydes as hereinabove set forth with an increase in transparency of layers coated with the photosensitive resinous composition.

When the photosensitive resinous material in accordance with the present invention is employed for a photosensitive liquid, the partially saponified polyvinyl acetates represented by the general formula (III) are employed in the form of an aqueous solution. The liquid may further contain an emulsifier for emulsifying oily materials on the face plate of a cathode ray tube and thereby preventing the oily area from being uncoated. The photosensitive liquid is coated on the face plate of a cathode ray tube in conventional manner and then exposed to light, causing the exposed areas to cure or harden by converting the resinous material into a water-insoluble material. On the other hand, the unexposed areas can be readily removed by washing with water. The selective light exposure is effected by using a conventional exposure mask such as a shadow mask, an aperture grille or any other mask having a desired pattern, particularly which has been used for color television picture tubes. A pattern to be formed by curing or hardening the coating may be in any form such as, for example, of a dotted pattern, a pattern with stripes or the like. The light to be used for curing may be of a variety of kinds ranging from ultraviolet rays to green range lights. After the unexposed or uncured areas are removed off by washing with water, a solution containing a light-absorbing substance or material is then coated over a whole area of the face plate thereof. The light-absorbing coating is then treated with a known so-called "lifting-off" substance such as hydrogen peroxide, an alkali hydrogenperhalogenate, e.g., potassium hydrogen-periodate, or an alkali peroxide. The lifting-off substance can serve as swelling and softening the portions cured or hardened by exposure to light. The swollen portions are then removed in conventional manner, for example, by washing with water. This results in the formation of a pattern of the light-absorbing layers corresponding to the unexposed or uncured portions on the inner face plate surface of the cathode ray tube.

With a slurry containing the photosensitive resinous material in accordance with the present invention and fluorescent particles which can illuminate in red, green or blue, a predetermined pattern of each of the given fluorescent materials is then formed in turn on the surface where the predetermined light-absorbing pattern was previously formed. The procedure which follows involves coating a fluorescent layer containing each of the given fluorescent materials illuminating red, green or blue color, respectively, on the face plate surface and selectively cured or hardened by exposure to light using a conventional mask. The unexposed or uncured areas or portions are then removed to form a desired predetermined fluorescent pattern in the particular color. Another fluorescent pattern having a color different from the previous one can be formed by repeating the procedure in substantially the same manner as set forth immediately hereinabove. A third repetition of the precedure can provide a desired fluorescent pattern having a color different from the two previous ones.

The slurry containing the photosensitive resinous material to be employed for the formation of a fluorescent pattern in accordance with the present invention may also contain a dispersing agent, an emulsifier and/or a defoamer. The dispersing agent may preferably be of an acrylic resin type. The emulsifier may preferably be of a polyoxyethylene type. The fefoamer may preferably include octyl alcohol or a polyoxyalkylene glycol derivative. These additives may be added in small amounts when needed. An pH adjusting agent such as ammonia and an adhesive aid such as colloidal silica may further be employed.

The photosensitive resinous materials in accordance with the present invention can present various advantages. Since the partially saponified polyvinyl acetates represented by the general formula (III) are readily cross-linked in an amount of exposed light smaller than required for conventional photosensitive materials, e.g., a dichromate, a velocity of curing in the case of the photosensitive resinous materials in accordance with the present invention is remarkably faster than the conventional one. This can increase productivity and does not require a light source of a special type, leading to a decrease in costs. No substantial variation in width of stripes in the light-absorbing pattern is found with a variation in amounts of lights exposed because of its high curing velocity, thereby providing a substantially constant width of the light-absorbing pattern. It is convenient from the viewpoint of operation because the photosensitive resinous materials in accordance with the present invention does not contain any chromium compound which is hazardous to human health and leads to a pollution. Since the partially saponified polyvinyl acetates as represented by the general formula (III) contains the acetal units as represented by the general formula (II) capable of serving as transparency in the resin, a fluorescent screen can provide a high transparency in light. They are also superior in adhesion of the fluorescent pattern to the face plate surface of a cathode ray tube so that this layer does not come off particularly during the development procedures. The use of the photosensitive resinous materials in accordance with the present invention can also increase an efficiency in illumination, leading to an increase in brightness by more than 10% as compared to conventional materials containing chromium compounds.

The following examples will illustrate the present invention more in detail.

EXAMPLE 1

To a solution of 100 g of a saponified polyvinyl acetate (degree of polymerization, 1,700; degree of saponification, 78%) in 900 c.c. of distilled water were added 10 g of 1-methyl-4-[p-(2,2-dimethoxylethoxy)styryl]-pyridinium p-toluenesulfonate and 2.4 g of acetaldehyde. After a further addition of 15.8 g of a 85% phosphoric acid, the solution was stirred at 40° C. for 16 hours to give the saponified polyvinyl acetate with 1-methyl-4-[p-(2,2-dimethoxylethoxy)styryl]pyridinium p-toluenesulfonate and acetaldehyde introduced therein. The ultraviolet analysis and the OH quantitative analysis revealed that the former was contained in the amount of 0.94 mol% and the latter in the amount of 2.5 mol% with respect to mole of the polyvinyl alcohol units, respectively.

The aqueous solution was then neutralized with ammonia water and mixed with 6 to 10 c.c. of "Tween" (trade mark: manufacture of Kao Atlas Co., Ltd.; a 5% methanol solution of a polyoxyethylene compound) and 4,800 to 6,200 c.c. of distilled water to give a photosensitive liquid. The polyoxyethylene compound was added for emulsifying oils on the coated surface to prevent the liquid from being uncoated. The compound of this kind to be employed for this purpose will be hereinafter called an "emulsifier" for brevity of explanation.

The photosensitive liquid was coated by rotation on the whole area of the inner surface of a face plate so as to give a dry thickness of 0.3 to 0.5 microns. The thickness is one-third times that of conventional photosensitive compositions. The use of a so-called emulsifier as hereinabove referred to prevent the formation of spaces or areas where no coating was otherwise present on the polyvinyl alcohol layer upon coating. This also served as strengthening adhesion to the face plate.

An aperture grille was then placed on the inner surface side of the face plate and exposed the photosensitive layer to light selectively. After the development of the layer, the unexposed portions were removed while a desired pattern of the exposed portions was left unremoved. The pattern was then treated with an agent for hardening the layer such as, for example, a boric acid aqueous solution having the composition as follows:

| Distilled water, | 4,250 c.c. |
| Methyl alcohol | 750 c.c. |
| Boric acid, | 30 g |

The inner surface with the hardened layers was then coated with a carbon aqueous solution having the following composition:

| "Aquadag" (trade mark: manufacture of Hitachi Chemical Co., Ltd.; a mixed aqueous solution of graphite and a binding agent, solids 22%) | 2.5 kg |
| Distilled water | 1.25 liters |
| Nonionic surfactant (1% methyl alcohol) | 7.5 c.c. |
| Distilled water (additionally added) | 6.25 liters. |

After the light-absorbing graphite layer was formed on a whole area of the face plate, the surface thereof was immersed in a 0.1 to 0.2% $H_2O_2$ aqueous solution, removing the carbon layer together with the cured polyvinyl alcohol layers and simultaneously leaving a desired pattern of the carbon layers bonded directly on the surface of the face plate.

With an aperture grille having each of desired patterns, a slurry comprising each of red, green and blue fluorescent materials containing the photosensitive resinous substance in accordance with the present invention was coated by rotation on the whole area of the inner surface of the face plate on which the graphite layers were already mounted. Each of the coatings was exposed to light and then developed to form a fluorescent pattern of stripes in red, green and blue colors, respectively. The resulting fluorescent screen was provided with a pattern having the light-absorbing layers thereon.

The slurries used for forming each of the colored fluorescent pattern had the following basic compositions:

| Green-illuminating fluorescent slurry: | |
|---|---|
| Saponified polyvinyl acetate aqueous solution (degree of polymerization, 1,700; degree of saponification, 78%) | 140 c.c. |
| Green-illuminating fluorescent substance | 225 g |
| Colloidal silica (adhesive aid) | 4 c.c. |
| Distilled water | 240 c.c. |
| Blue-illuminating fluorescent slurry: | |
| The same saponified polyvinyl acetate aqueous solution as above | 220 c.c. |
| Blue-illuminating fluorescent substance | 230 g |
| Distilled water | 188 c.c. |
| Red-illuminating fluorescent slurry: | |
| The same saponified polyvinyl acetate aqueous solution as above | 210 c.c. |
| Red-illuminating fluorescent substance | 210 g |
| Distilled water | 169 c.c. |

These slurries may contain, if needed, small amounts of an acrylic dispersing agent, a polyoxyethylene type emulsifier, a defoamer, e.g., polyoxyalkylene glycol derivative or octyl alcohol, and/or a pH adjusting agent, e.g., ammonia.

EXAMPLE 2

A fluorescent screen was prepared by following the procedure of Example 1 with the exception that 20% of the distilled water in the photosensitive liquid was replaced by isopropyl alcohol.

EXAMPLE 3

A color fluorescent screen was prepared by following the procedure of Example 1 with the exception that a partially saponified polyvinyl acetate (degee of polymerization, 1,400; degee of saponification, 87%), 1-methyl-4-(p-formylstyryl)pyridinium methosulfate and n-butylaldehyde were employed in place of the corresponding compounds. The amounts of the buthyl-aldehydes introduced in the polymer are shown in Table below.

COMPARATIVE EXAMPLE 1

A photosensitive liquid having the following composition was prepared:

| Distilled water | 2,815 c.c. |
|---|---|
| Methyl alcohol | 350 c.c. |
| Polyvinyl alcohol (9% aq. solution, degree of polymerization, 1,700; degree of saponification, 87%) | 1,780 c.c. |
| Ammonium dichromate | 43 c.c. |
| Polyoxyethylene compound (emulsifier; a 5% ethanol solution) | 1.2 c.c. |
| Ammonium dichromate concentration | approximately 3% |

EXAMPLE 4

The procedure of Example 1 was followed with the exception that the stilbazolium acetal compound was employed in an amount sufficient to give 0.5 mol% of the stilbazolium groups with respect to mole of the polyvinyl alcohol units.

EXAMPLE 5

In substantially the same manner as in Example 4, there was prepared the partially saponified polyvinyl acetate having the stilbazolium groups in an amount of 0.7 mol% with respect to mole of the polyvinyl alcohol units.

COMPARATIVE EXAMPLE 2 & 3

The procedure of Comparative Example 1 was followed so as to give a photosensitive liquid in the ammonium dichromate concentration of 7% and 11%, respectively.

EXPERIMENT 1

With the photosensitive liquids containing the partially saponified polyvinyl acetates of Example 4, 5 and 1, respectively, they were exposed to light in varying amounts and cured to determine widths of the stripes of a pattern. The results are shown in FIG. 1, in which the solid line indicates a 75% light exposure, the dot-dashed line indicates a 48% light exposure, and the dotted line indicates a 34% light exposure.

In the same manner as hereinabove, the photosensitive liquids of Comparative Examples 1, 2 and 3, respectively, were treated. The results are shown in FIG. 2 in which the solid line indicates a 75% light exposure, the dot-dashed line indicates a 48% light exposure, and the dotted line indicates a 34% light exposure.

It is shown in FIG. 1 that the photosensitive resinous materials in accordance with the present invention can give stripes having widths which do not vary to a great extent with varying the light exposure from 75% to 48%.

Figure 2:
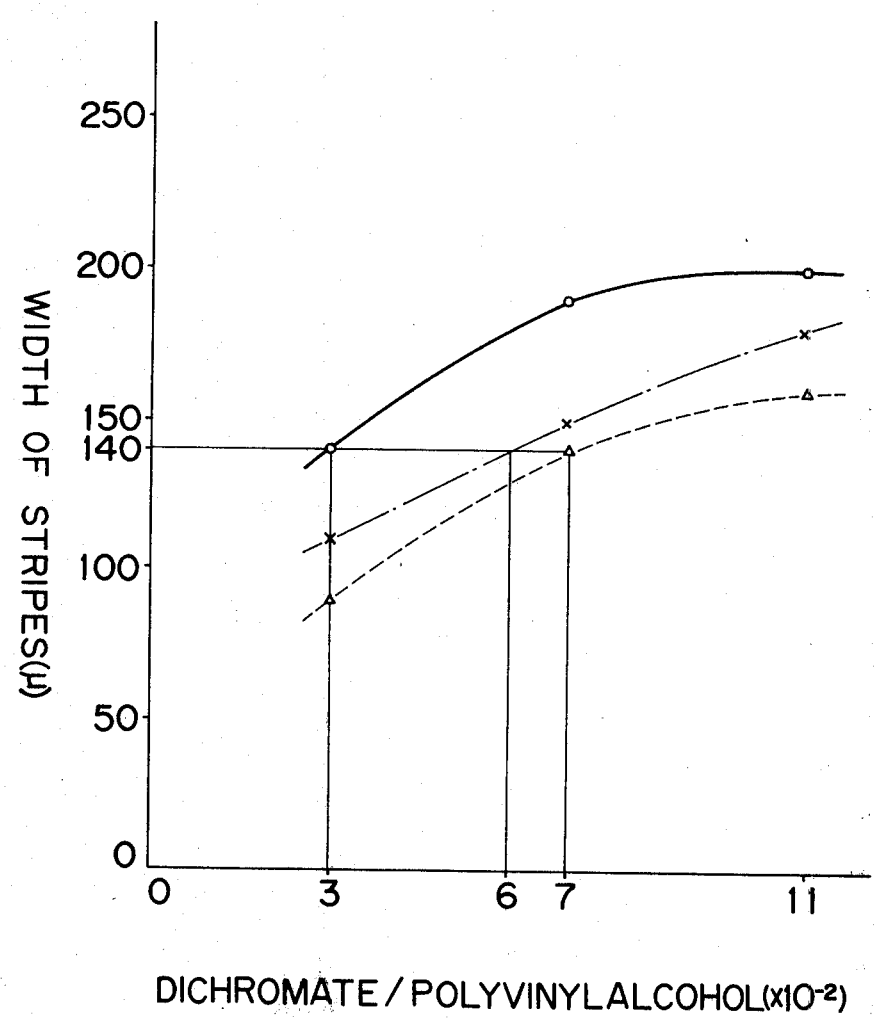
FIG. 2 is a graph illustrating the relationship of width of stripes (in microns) with a dichromate/polyvinylalcohol ($\times 10^{-2}$) in conventional photosensitive liquids.

From a comparison of FIG. 1 with FIG. 2, it is found that, in order to give stripes having the width of 140 microns, the photosensitive liquid of Comparative Example 1 having the dichromate concentration of about 3% required a 75% light exposure, whereas the 48% light exposure was required for the photosensitive liquid having the stilbazolium group concentration of 0.65% and the 34% light exposure was required for a 0.7 mol% concentration of the stilbazolium groups. It is accordingly noted that, in conventional photosensitive liquids having the compositions as set forth in Comparative Example 1, the dichromate concentration should be increased from 3% to 6%, viz., two-fold in order to give stripes having the width of 140 microns when the light in the amount of 48% is exposed and further, where the 34% light exposure is conducted, the dichromate concentration should be increased from 3% to 7%. Thus, it may be noted that the photosensitive resinous materials in accordance with the present invention can provide a given width of stripes without varying amounts of the photosensitive compound, whereas the conventional photosensitive liquids required a great increase in amounts of the photosensitive agent, i.e. ammonium dichromate.

EXPERIMENT 2

With the partially saponified polyvinyl acetates having varying amounts of the butyral units as prepared in Example 5, the photosensitive liquids were tested for their strength of adhesion and sensitivity in comparison with photosensitive liquids containing the butyral units beyond the preferred scope and the conventional photosensitive liquid of Comparative Example 1. The results are shown in Table below.

TABLE

| Test Nos. | Photosensitive Liquids (mol % of Butyral Units) | Adhesion Strength | Sensitivity |
|---|---|---|---|
| 1 | 0 | UF | FA |
| 2 | 0.3 | UF | FA |
| 3 | 0.5 | AV | FA |
| 4 | 1.0 | AV | FA |
| 5 | 2.0 | FA | FA |
| 6 | 4.0 | FA | FA |
| 7 | 8.0 | FA | AV |
| 8 | 12.0 | FA | UF |
| 9 | Conventional | AV | AV |

Note
UF = Unfavorable
AV = Average
FA = Favorable

The tests with respect to adhesion strength were carried out in a Step Tablet filter (manufacture of Eastman Kodak Company). The evaluation was made that, when amounts of lights passing through the tablets were continuously decreased, the longer the length of coatings after light exposure and development, the better the adhesion strength. The sensitivity was determined with respect to a situation on the coatings after cured by the light exposure.

It is noted from Table above that the partially saponified polyvinyl acetates in accordance with the present invention having the "normal" acetal units ranging from approximately 0.5 to 10.0 mol% with respect to mole of the polyvinyl alcohol units can provide a favorable adhesion strength without decreasing its sensitivity to light to a great extent. It is also found that they can improve characteristics on the adhesion strength and sensitivity in comparison with the conventional photosensitive liquids containing ammonium dichromate.

EXPERIMENT 3

With the photosensitive liquid of Example 1, it was tested for its stability in various pH ranges. The test results are shown in FIG. 3 in which the thin solid line indicates a conversion at pH 7 in the width of stripes having the original width of 110 microns, the thick solid line indicates the conversion of the 100-micron thick stripes at pH 7.0, the dotted line indicates the conversion of the 110-micron thick stripes at pH 2 to 3, and the dot-dashed line indicates the conversion of the 80-micron thick stripes at pH 2 to 3. It is found from FIG. 3 that, when the photosensitive liquids are in neutral pH ranges, only a small conversion in width of stripes was observed, whereas there was a big conversion in strongly acidic ranges.

What is claimed is:

1. A partially saponified polyvinyl acetate having at least one stilbazolium group-containing photosensitive unit represented by the following general formula:

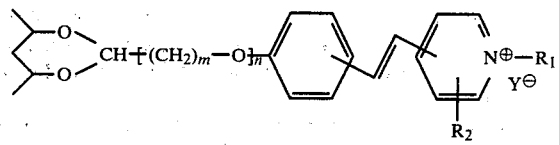

(wherein $R_1$ is hydrogen atom, an unsubstituted or substituted alkyl group, an alkenyl group or an aralkyl group, $R_2$ is hydrogen atom or an unsubstituted or substituted group, Y is a conjugated base of an inorganic or organic acid, m is an integer of 1 to 6, and n is 0 or 1) and an acetal unit represented by the following general formula:

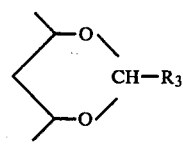

(wherein $R_3$ is hydrogen atom or an alkyl group); the acetal units being contained therein in an amount of approximately 0.5 to 10.0 mol% with respect to mole of the polyvinylalcohol units thereof; the stilbazolium group-containing units being contained therein in an amount of approximately 0.5 to 5.0 mol% with respect to mole of the polyvinylalcohol units thereof and having a degree of polymerization of approximately 500 to 3,000 and a degree of saponification of approximately 60% or higher.

2. A photosensitive resinous material comprising a partially saponified polyvinyl acetate having at least one stilbazolium group-containing photosensitive unit represented by the following general formula:

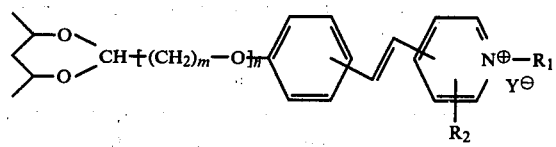

(wherein $R_1$ is hydrogen atom, an unsubstituted or substituted alkyl group, an alkenyl group or an aralkyl group, $R_2$ is hydrogen atom or an unsubstituted or substituted alkyl group, Y is a conjugated base of an inorganic or organic acid, m is an integer of 1 to 6, and n is 0 or 1) and an acetal unit represented by the following general formula:

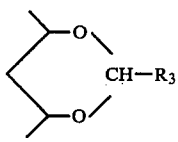

(wherein $R_3$ is hydrogen atom or an alkyl group); the acetal units being contained therein in an amount of approximately 0.5 to 10.0 mol% with respect to mole of the polyvinylalcohol units thereof.

3. The photosensitive resinous material according to claim 2, wherein the acetal unit is formal, acetoacetal or butyral unit.

4. The photosensitive resinous material according to claim 2, wherein the stilbazolium group-containing units are contained in an amount of approximately 0.5 to 5.0 mol% with respect to mole of the polyvinylalcohol units thereof.

5. The photosensitive resinous material according to claim 2, wherein the partially saponified polyvinyl acetate has a degree of polymerization of approximately 500 to 3,000.

6. The photosensitive resinous material according to claim 2, wherein the partially saponified polyvinyl acetate has a degree of saponification of approximately 60% or higher.

7. The photosensitive resinous material according to claim 6, wherein the degree of saponification is approximately 70% or higher.

8. The photosensitive resinous material according to claim 2, further containing water as a solvent.

9. The photosensitive resinous material according to claim 8, wherein approximately 10 to 25% by weight of water is replaced by a water-soluble lower alcohol.

10. The photosensitive resinous material according to claim 9, wherein the water-soluble lower alcohol is methanol, ethanol or isopropanol.

11. A photosensitive resinous composition comprising a partially saponified polyvinyl acetate having at least one stilbazolium group-containing photosensitive unit represented by the following general formula:

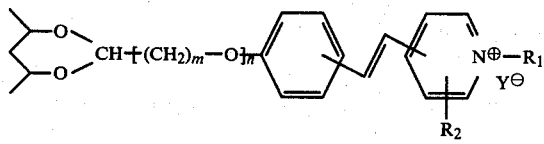

(wherein $R_1$ is hydrogen atom, an unsubstituted or substituted alkyl group, an alkenyl group or an aralkyl group, $R_2$ is hydrogen atom or an unsubstituted or substituted alkyl group, Y is a conjugated base of an inorganic or organic acid, m is an integer of 1 to 6, and n is 0 or 1) and an acetal unit represented by the following general formula:

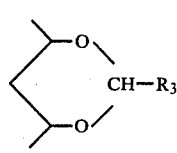

(wherein $R_3$ is hydrogen atom or an alkyl group); the acetal units being contained therein in an amount of approximately 0.5 to 10.0 mol% with respect to mole of the polyvinyl alcohol units thereof.

12. The photosensitive resinous composition according to claim 11, wherein the acetal unit is formal, acetoacetal or butyral unit.

13. The photosensitive resinous composition according to claim 11, wherein the stilbazolium group-containing units are contained in an amount of approximately 0.5 to 5.0 mol% with respect to mole of the polyvinyl alcohol units thereof.

14. The photosensitive resinous composition according to claim 11, wherein the partially saponified polyvinyl acetate has a degree of polymerization of approximately 500 to 3,000.

15. The photosensitive resinous composition according to claim 11, wherein the partially saponified polyvinyl acetate has a degree of saponification of approximately 60% or higher.

16. The photosensitive resinous composition according to claim 15, wherein the degree of saponification is approximately 70% or higher.

17. The photosensitive resinous composition according to claim 11, further containing water as a solvent.

18. The photosensitive resinous composition according to claim 17, wherein approximately 10 to 25% by weight of water is replaced by a water-soluble lower alcohol.

19. The photosensitive resinous composition according to claim 18, wherein the water-soluble lower alcohol is methanol, ethanol or isopropanol.

20. The photosensitive resinous composition according to claim 11, further containing a pH adjusting agent.

21. The photosensitive resinous composition according to claim 20, wherein the pH adjusting agent is ammonia.

* * * * *